(12) United States Patent
Touzelbaev

(10) Patent No.: US 6,794,620 B1
(45) Date of Patent: Sep. 21, 2004

(54) FEEDFORWARD TEMPERATURE CONTROL OF DEVICE UNDER TEST

(75) Inventor: Maxat Touzelbaev, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 272 days.

(21) Appl. No.: 10/039,525

(22) Filed: Nov. 7, 2001

(51) Int. Cl.[7] .............................................. H05B 1/02
(52) U.S. Cl. ....................... 219/497; 219/209; 219/505; 324/763
(58) Field of Search ................................ 219/497, 494, 219/501, 210, 209, 211, 505; 324/763, 765, 713

(56) References Cited

U.S. PATENT DOCUMENTS

| | | | |
|---|---|---|---|
| 3,710,251 A | * | 1/1973 | Hagge et al. .................. 73/15 |
| 3,922,527 A | * | 11/1975 | Witkin et al. ................ 219/210 |
| 5,205,132 A | * | 4/1993 | Fu .......................... 236/15 BB |
| 6,489,793 B2 | * | 12/2002 | Jones et al. .................. 324/760 |

* cited by examiner

*Primary Examiner*—Mark Paschall

(57) ABSTRACT

In order to maintain a semiconductor device under test at a generally constant temperature, the temperature change of the device under test is characterized as the device under test undergoes changes in power level in response to an electrical testing sequence. Additionally, the temperature change of the device under test is characterized in response to changes in power level of a thermal head associated with the device under test. This information is used to select power levels of the thermal head during the electrical testing sequence so that the device under test remains at a substantially constant temperature during the electrical testing sequence.

15 Claims, 7 Drawing Sheets

FEEDFORWARD TEMPERATURE CONTROL OF DEVICE UNDER TEST

BACKGROUND OF THE INVENTION

1. Field of the Invention

This invention relates generally to semiconductor technology, and more particularly, to maintaining substantially constant temperature of a semiconductor device under test.

2. Discussion of the Related Art

Semiconductor devices typically undergo a variety of electrical test procedures, including short-circuit tests, burn-in tests, and device functional tests to insure their proper operation. During for example functional testing, it is important that the temperature of the device under test be held at a chosen, substantially constant value. However, during such functional testing, the power level of the device may vary greatly, causing the temperature of the device to fluctuate. The most important parameter is junction temperature, or the temperature of active regions in the device (there may be some temperature non-uniformity within the device). In dealing with this problem, it is well known to provide a thermal head 10 a surface 11 which may be brought into contact with the lid 12 of a device 14 under test, for example, a flip-chip mounted on a printed circuit board 16 (FIG. 1), or in the case of an unlidded device, in contact with the device 14 itself (FIG. 2). The thermal head 10 typically includes an electric heating element 18 along surface 11 the output of which can be increased and decreased by respectively increasing and decreasing electrical current flow therethrough, and a passage 20 through which coolant 22, for example, water, may flow. By changing electrical current flow and/or providing or cutting off coolant flow, the temperature of the thermal head 10, and thus the temperature of the device under test 14 adjacent thereto, can be adjusted or varied. As the temperature of the device under test 14 varies due to changes in power level thereof as described above, the temperature of the thermal head 10 is caused to change to compensate for the changing temperature of the device 14, in order to attempt to maintain the device under test 14 at a constant, chosen temperature.

One approach in attempting to maintain the device under test 14 at a substantially constant temperature is to compare the temperature of the device under test 14 with a desired temperature as the temperature of the device under test 14 varies due to fluctuation of power level thereof. A PID (Proportional Integral Derivative) controller is used to sense that difference and vary the temperature of the thermal head 10 in order to bring the temperature of the device under test 14 back to the chosen value. However, this approach requires an accurate measurement of the temperature of the device under test 14, which cannot realistically be achieved with a lidded device if a temperature sensor is not incorporated in the device, and is also difficult even with an unlidded device. Additionally, in the case of a lidded device, because of the thermal capacitance of the lid, a substantial delay occurs in change of temperature of the device under test through change in the temperature of the thermal head. Thus, this approach has not proven entirely satisfactory.

Another approach, currently practiced by Schlumberger, Ltd. for unlidded devices uses an algorithm as follows:

$$T_c = T_d - K_\theta P_d$$

where:

$T_d$=temperature of device under test;
$T_c$=temperature of thermal head
$P_d$=power dissipated by device under test;
$K_\theta$=thermal stack up coefficient of device (overall thermal resistance between the die and the thermal head).

In this approach, the device under test temperature $T_d$ is chosen and thermal head temperature $T_c$ is set in accordance with this formula. The power dissipated by the device under test 14 is monitored. Through use of this formula, the temperature of the thermal head 10 can be varied in an attempt to hold the device under test 14 at a substantially constant temperature. However, it has been found that while ideally $K_\theta$ is a constant, this has proven not to be the case, that is $K_\theta$ may vary from one test run to another, causing inaccuracies in the attempt to hold the device under test 14 at a substantially constant temperature. Additionally, for functioning of this system, substantial, rapid swings in thermal head temperature are required, in turn requiring expensive and complicated hardware.

Therefore, what is needed is an approach in maintaining a device under test at a substantially constant temperature which overcomes the problems set forth above, meanwhile being simple, inexpensive and effective, and is equally effective in the case of lidded and unlidded devices.

SUMMARY OF THE INVENTION

In maintaining a device under test at a generally constant temperature, the temperature change of the device under test is characterized as the device under test undergoes changes in power level in response to an electrical testing sequence. Additionally, the temperature change of the device under test is characterized in response to changes in power level of a thermal head. Using this information, power levels at the thermal head are selected for use during the electrical testing sequence, based at least in part on the characterization of the temperature change of the device under test in response to the electrical testing sequence, so that the device under test remains at a substantially constant temperature during the electrical testing sequence.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventor for practicing the invention.

Figure 1:
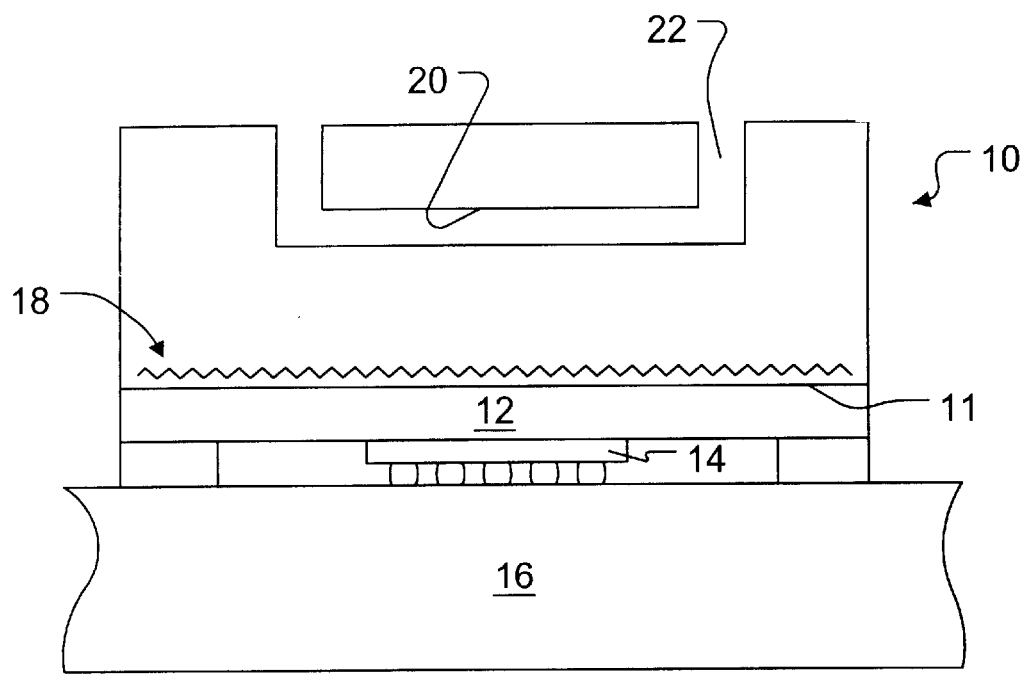
FIG. 1 is a sectional view of apparatus for illustrating a typical prior art process, with a lidded device under test.
Figure 2:
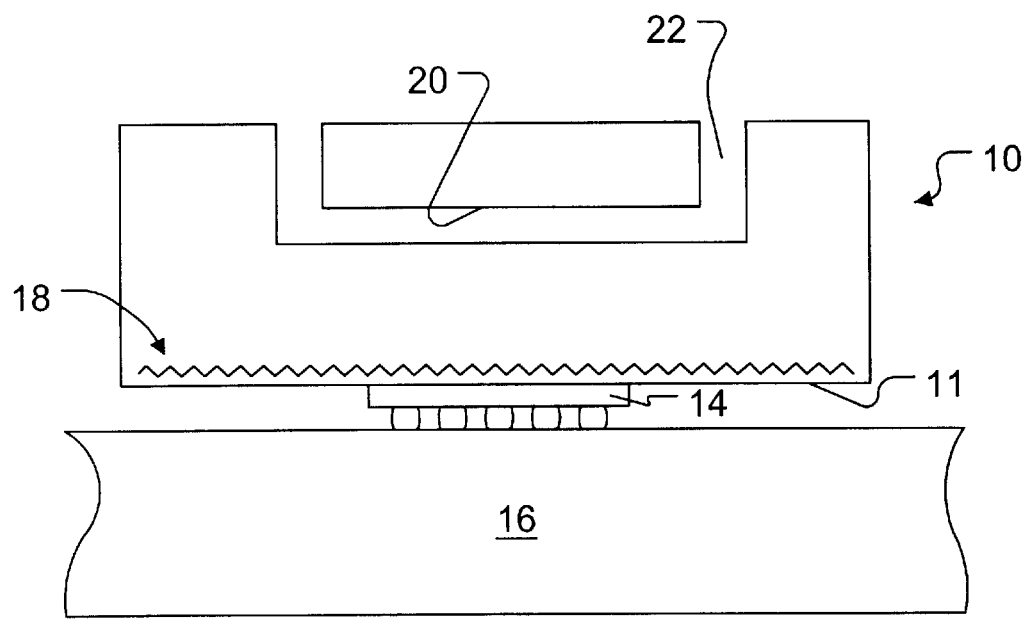
FIG. 2 is a sectional view similar to that shown in FIG. 1, but with an unlidded device under test.
Figure 3:
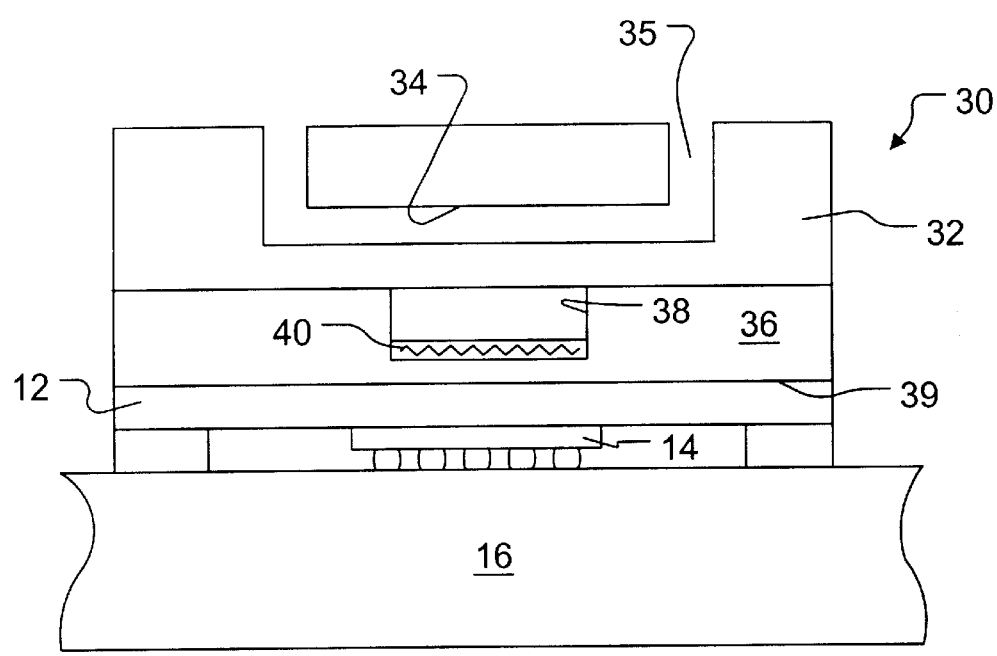
FIG. 3 is a sectional view of apparatus used in furtherance of the present invention.

With reference to FIG. 3, a thermal head assembly 30 includes a thermal head 32 having a passage 34 through which coolant 35 may flow, and a plate 36 mounted thereto and having a recess 38 which houses an electric heating element 40. In use, a surface 39 of the plate 36 is in contact with the lid 12 of a device under test 14, for example, a flip chip mounted on a printed circuit board 16.

Figure 4:
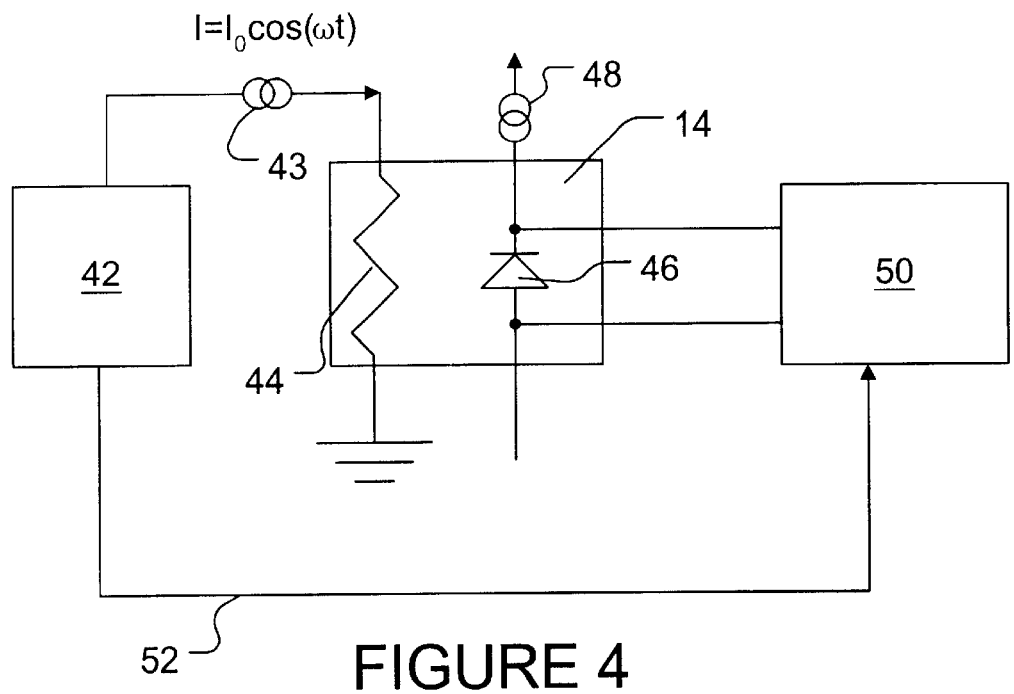
FIG. 4 is a schematic view of a portion of the apparatus used in furtherance of a part of the present invention.
Figure 6:
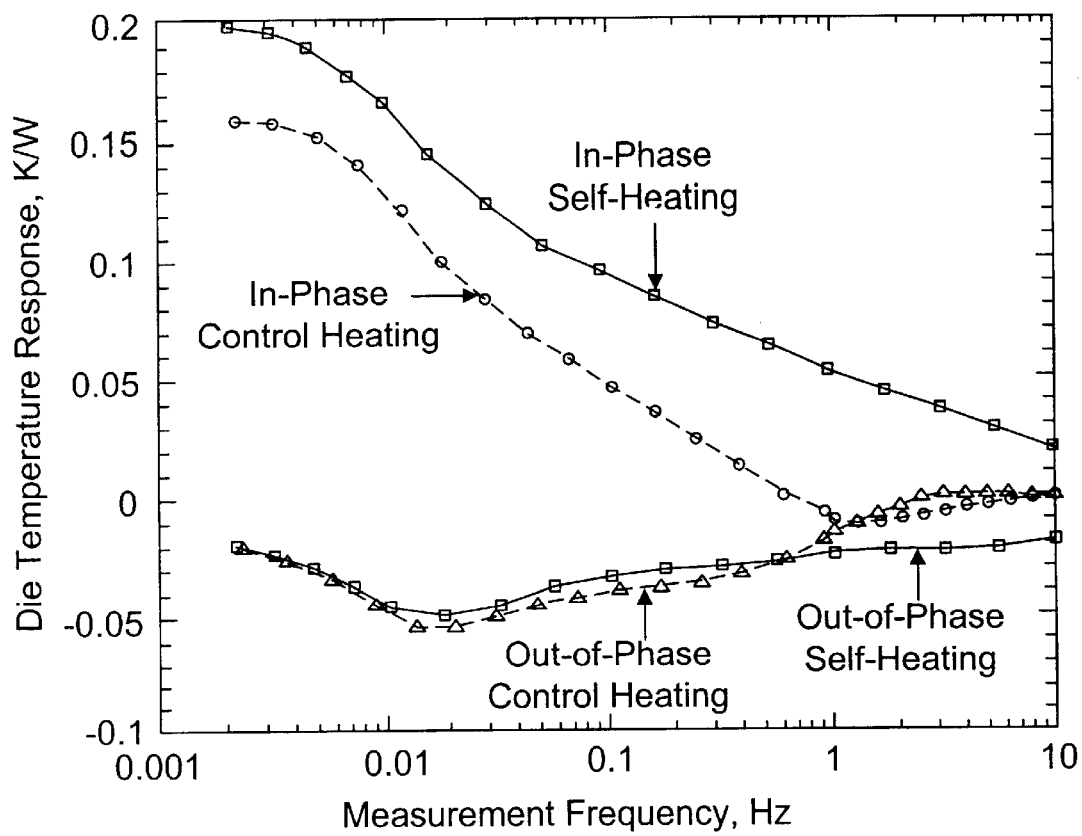
FIG. 6 is a graphical view of die temperature response vs. frequency in the present invention.

Initially, and with reference to FIG. 4, the thermal characteristics of the device 14 are determined upon application of various levels of power thereto. The device 14 is characterized using harmonic Joule heating and a temperature sensor in the form of a diode 46 in the same package as the device 14. The temperature response to self heating (and heating control by heating element 40 as later described) are determined at a spectrum of frequencies. A function generator 42 provides a source of current 43 $I=I_o\cos(\omega t)$ to the device 14 (resistance of the device 14 indicated by resistor 44). Application of this harmonic current to the device 14 causes the temperature of the device 14 to fluctuate. The temperature sensitive diode 46 is included as part of the device 14, and a current source 48 provides a constant current through the diode 46. As a given level of power is supplied to the device 14 ($P=I^2R$), the temperature of the device 14 has periodic components (in this case at twice the frequency of the electrical current due to $I^2R$ law)in response to harmonic Joule heating which is detected using thermal diode 46. The voltage difference from one side of the diode 46 to the other, which is proportional to the temperature of the device 14, is provided to a differential input of a lock-in amplifier 50 which is also supplied a reference signal 52 from the function generator 42. It will be seen that upon a given level of power being supplied to the device 14, a corresponding device 14 temperature can be noted by reading the voltage drop across the diode 46. The device 14 temperature response (FIG. 6) is noted for each of a large range of frequencies of signal applied to the device 14 by the function generator 42. The device 14 temperature response has two components, due to "In-Phase Self-Heating", as shown in FIG. 6, and "Out-Of-Phase Self-Heating"(out of phase with the input power) as also shown in FIG. 6. Both of these components are detected by the lock in amplifier 50.

Figure 5:
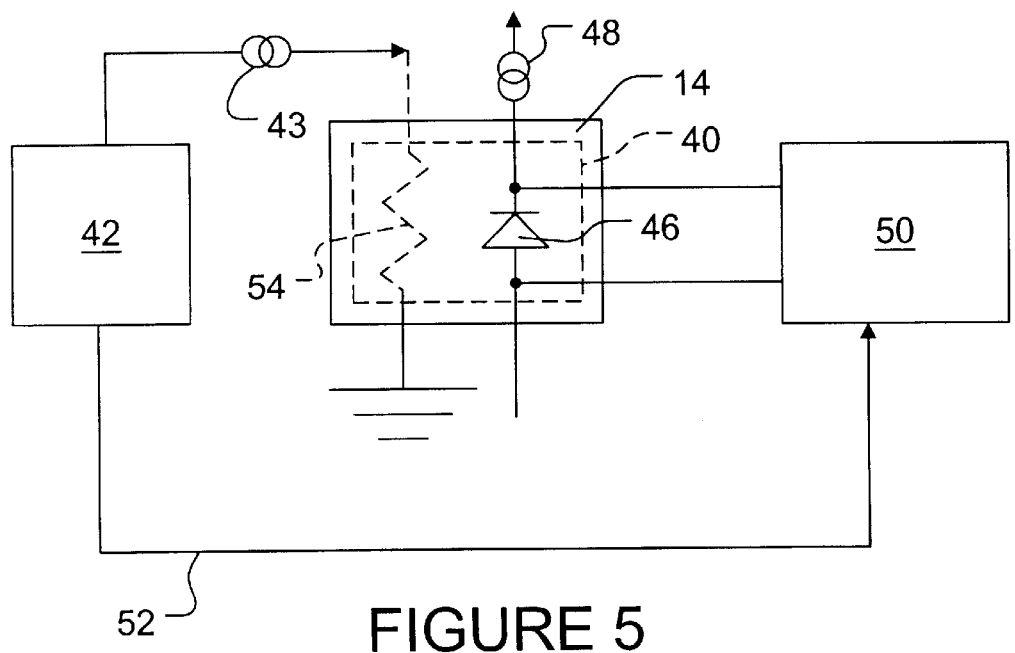
FIG. 5 is a schematic view of a portion of the apparatus used in furtherance of another part of the present invention.

With reference to FIG. 3 and FIG. 5, surface 39 of the plate 36 of the thermal head assembly 30 is in contact with the lid 12 of a device 14 under test, as shown in FIG. 3. Then, the thermal characteristics of the device 14 are determined without application of power to the device 14, but with variations in frequency (through application of signals of different frequencies) applied to the heating element 40 of the thermal head assembly 30 (resistance of the heating element 40 indicated by resistor 54). The diode 46 of the device 14 is used in the same manner as above, i.e., the diode 46 is temperature sensitive, and a current source 48 provides a given current through the diode 46. Application of current to the heating element 40, without application of power to the device 14, causes the temperature of the device 14 to increase. As a power level at a given frequency is supplied to the heating element 40, temperature of the device 14 changes and is detected by the diode 46. Again, this voltage difference from one side of the diode 46 to the other is proportional to the temperature of the device 14, and is provided to a lock-in amplifier 50. It will be seen that upon a given frequency supplied to the heating element 40, a corresponding device 14 temperature can be noted by reading voltage across the diode 46. The device 14 temperature response has two components, "In-Phase control Heating" and "Out-Of-Phase Control Heating"(FIG. 6).

FIG. 6 illustrates how the temperature of the device 14 responds independently to (1) functional testing thereof (without functioning of the heating element 40) and (2) operation of the heating element 40 of the thermal head assembly 30 in close proximity thereto, i.e., with the surface 39 of the plate 36 in contact with the lid 12, without functioning of the device 14. With the thermal head assembly 30 removed from the lid 12, since the functional testing of the device under test 12 is specified and all characteristics of the testing are known prior to actual test, the temperature of the device 14 through self heating can accurately be predicted by means of the above characterization. Then, with the surface 39 of the plate 36 in contact with the lid 14, at any given portion of the functional test, a power level of the heating element 40 can be provided, determined by the state of self heating of the device under test 14 as described above, to keep the device 14 at a substantially constant, chosen temperature.

For example, and again with reference to FIG. 6, assuming that the device 14 has provided thereto a signal of 0.01 Hz during a portion of the functional testing thereof, a device 14 temperature response of 0.18 K/W is provided for "in phase self heating" of the device 14. Meanwhile, with that same signal provided to the heating element 40, a device temperature response of 0.13 K/W is provided for "in phase control heating". At a given frequency, therefore, the device 14 exhibits a greater temperature response in self heating than in heating by the heating element 40. An adjustment must be made for this difference for maintenance of substantially constant temperature of the device 14. The ratio of sensitivity is 0.18/0.13=1.38, so it will be seen that the power level of the heating element 40 must be adjusted by this factor, i.e., the current through the heating element 40 must be sufficiently lowered to properly compensate for the increase in temperature which would occur due to device 14 self heating.

A mathematical analysis is provided further on.

Figure 7:
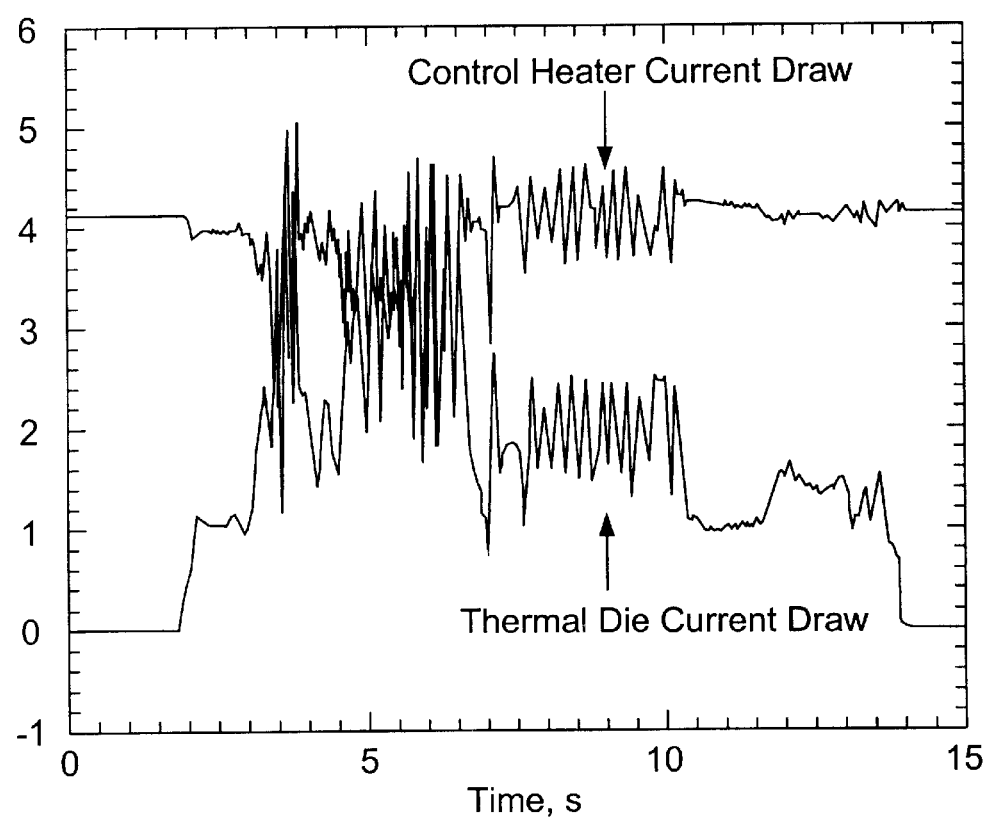
FIG. 7 is a graphical view of current draw vs. time in the present invention.
Figure 8:
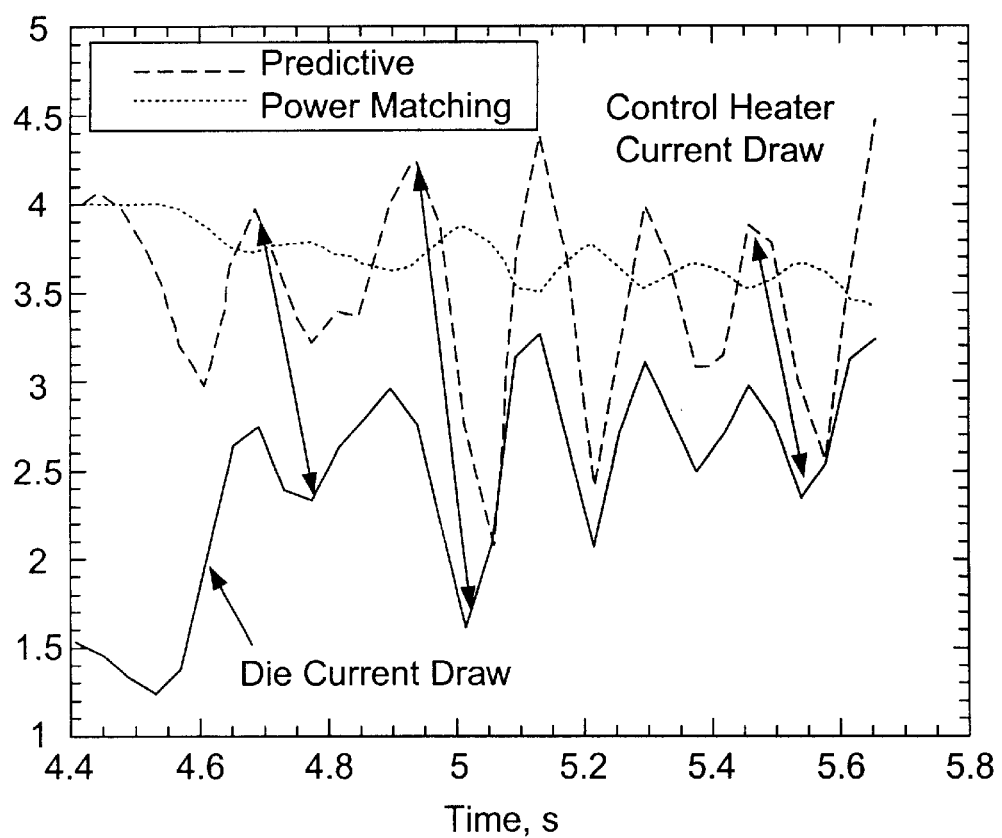
FIG. 8 is a graphical view of predictive control of power dissipated in the thermal head.

The above operation is carried outer for the entire spectrum of power levels applied in the complete testing sequence of the device 14. Thus, the desired power levels of the heating element 40 for keeping the device 14 at a substantially constant temperature during this testing sequence can be arrived at. Using Fourier transform, the desired level of power applied to the device 14 and the heating element 40 in the time domain can be arrived at (FIG. 7). In fact, and with reference to FIG. 8, showing an enlarged portion of FIG. 7, the changes in heating element 40 current draw are shown to slightly precede in time the changes in device under test 14 current draw, so as to anticipate by a small amount of time the changes in power of the device 14. Power matching is indicated in FIG. 8.

Figure 9:
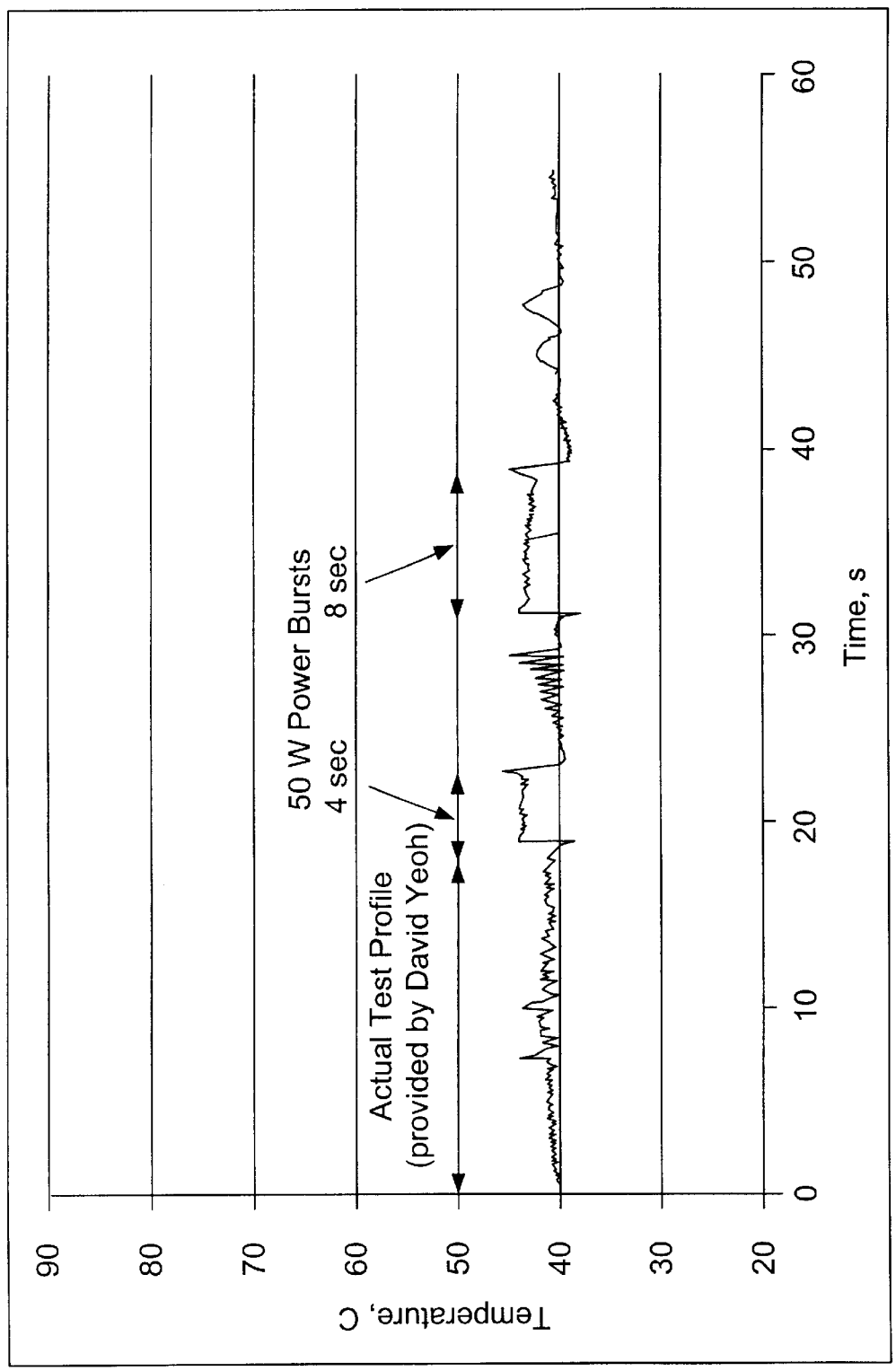
FIG. 9 is a graphical view illustrating temperature control of the device under test over a period of time.

FIG. 9 illustrates results of the present invention in use. As shown therein, over a period of time, with the device 14 undergoing functional tests at a variety of power levels, the device 14 temperature is maintained at close to the desired 40° C., through anticipative adjustment of the power level of the heating element 40 of the thermal head assembly 30.

It will be seen that the present system overcomes the problems of the prior art in keeping a device under test, particularly a lidded device under test, at a substantially constant temperature. Additionally, the system can readily be applied to current thermal head apparatus, avoiding the expense and complication of prior art systems.

The foregoing description of the embodiment of the invention has been presented for purposes of illustration and description. It is not intended to be exhaustive or to limit the invention to the precise form disclosed. Other modifications or variations are possible in light of the above teachings.

Analysis

The transform operator establishes relationship between the time and frequency domains for both temperature and heating power.

$$\theta(\omega) = \Phi[T(t)]$$

$$p(\omega) = \Phi[P(t)]$$

where T(t) is the desired temperature of the device.
Assuming linearity of the temperature response we obtain $$\theta(\omega) = P_H(\omega)\tau_H(\omega) + P_c(\omega)\tau_c(\omega)$$

From this relation we can extract the desired power at the heater $$P_H(\omega) = \frac{f(\omega)}{\tau_H(\omega)}[\theta(\omega) - p_C(\omega)\tau_C(\omega)]$$

where f is a filter function, which may be chosen to avoid convolution of high frequencies into the control sequence, not always necessary due to diminished responses at this frequency range. The input to the heater in time domain is obtained using inverse Fourier transform.

$$P_H(t) = \Phi^{-1}[p_H(\omega)]$$

In operator form the heater input can be written as $$P_H(t) = A \otimes P_c(t) + B \otimes T(t)$$

where $$A = -\Phi^{-1} \otimes \left\{ f(\omega) \frac{\tau_C(\omega)}{\tau_H(\omega)} \Phi \right\}$$

$$B = -\Phi^{-1} \otimes \left\{ f(\omega) \frac{1}{\tau_H(\omega)} \Phi \right\}$$

Where:
- t: time, s
- $\omega$: angular frequency, rad s$^{-1}$
- T: temperature in time domain, K
- $\theta$: temperature in frequency domain, K
- $P_c$: dissipated power due to self-heating (time domain), W
- Pc: dissipated power due to self-heating (frequency domain), W
- $P_H$: dissipated power due to control heating (time domain), W
- PH: dissipated power due to control heating (frequency domain), W
- $\theta$: temperature in frequency domain, K
- $\tau_c$: reduced temperature response due to self-heating (frequency domain), K W$^{-1}$
- $\tau_H$: reduced temperature response due to control heating (frequency domain), K W$^{-1}$
- f: filter function (e.g. Butterworth filter), dimensionless
- A: operator defined in text
- B: operator defined in text
- $\otimes$: operation symbol The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of regulating temperature of a device under test comprising:
   characterizing the temperature change of a device under test as the device under test undergoes changes in power level in response to an electrical testing sequence; and
   selecting power levels of a device under test-associated thermal head during the electrical testing sequence, based at least in part on the characterization of the temperature change of the device under test in response to the electrical testing sequence.

2. The method of claim 1 wherein the step of selecting power levels of the thermal head comprises varying electrical current in the thermal head.

3. The method of claim 2 wherein the step of selecting power levels of the thermal head is undertaken only by varying electrical current in the thermal head.

4. The method of claim 1 and further comprising the step of providing that the device under test is a lidded device under test.

5. The method of claim 1 wherein the step of characterizing the temperature change of a device under test as the device under test undergoes changes in power level in response to an electrical testing sequence comprises providing an element through which current may be applied, the voltage drop across the element varying with temperature.

6. A method of maintaining a device under test at a generally constant temperature, comprising:
   characterizing the temperature change of a device under test as the device under test undergoes changes in power level in response to an electrical testing sequence;
   characterizing the temperature change of the device under test in response to changes in power level of a device under test-associated thermal head;
   selecting power levels of the thermal head during the electrical testing sequence, based at least in part on the characterization of the temperature change of the device under test in response to the electrical testing sequence, so that the device under test remains at a substantially constant temperature during the electrical testing sequence.

7. The method of claim 6 wherein the step of selecting power levels of the thermal head comprises varying electrical current in the thermal head.

8. The method of claim 7 wherein the step of selecting power levels of the thermal head is undertaken only by varying electrical current in the thermal head.

9. The method of claim 6 and further comprising the step of providing that the device under test is a lidded device under test.

10. The method of claim 6 wherein the step of characterizing the temperature change of a device under test as the device under test undergoes changes in power level in response to an electrical testing sequence comprises providing an element through which current may be applied, the voltage drop across the element varying with temperature.

11. The method of claim 6 wherein the step of characterizing the temperature change of the device under test in response to changes in power level of a device under test-associated thermal head comprises providing an element through which current may be applied, the voltage drop across the element varying with temperature.

12. The method of claim 10 wherein the step of providing an element through which current may be applied comprises providing a diode.

13. Apparatus for maintaining a device under test at a generally constant temperature, comprising:

a first structure for characterizing the temperature change of a device under test as the device under test undergoes changes in power level in response to an electrical testing sequence;

a second structure for characterizing the temperature change of the device under test in response to changes in power level of a device under test-associated thermal head; and means for selecting power levels of the thermal head during the electrical testing sequence, based at least in part on the characterization of the temperature change of the device under test in response to the electrical testing sequence, so that the device under test remains at a substantially constant temperature during the electrical testing sequence.

14. The apparatus of claim 13 wherein the first structure comprises an element through which current may be applied, the voltage drop across the element varying with temperature.

15. The apparatus of claim 13 wherein the second structure comprises an element through which current may be applied, the voltage drop across the element varying with temperature.

* * * * *